US010266670B2

(12) United States Patent
Sbriglia et al.

(10) Patent No.: US 10,266,670 B2
(45) Date of Patent: *Apr. 23, 2019

(54) ARTICLES PRODUCED FROM VDF-CO-(TFE OR TRFE) POLYMERS

(71) Applicant: W. L. Gore & Associates, Inc., Newark, DE (US)

(72) Inventors: Guy A. Sbriglia, Christiana, PA (US); Gregory J. Shafer, Oxford, PA (US)

(73) Assignee: W. L. Gore & Associates, Inc., Newark, DE (US)

( * ) Notice: Subject to any disclaimer, the term of this patent is extended or adjusted under 35 U.S.C. 154(b) by 86 days.

This patent is subject to a terminal disclaimer.

(21) Appl. No.: 14/950,600

(22) Filed: Nov. 24, 2015

(65) Prior Publication Data
US 2016/0075854 A1    Mar. 17, 2016

Related U.S. Application Data

(63) Continuation of application No. 14/811,100, filed on Jul. 28, 2015, now Pat. No. 9,441,088.

(60) Provisional application No. 62/030,442, filed on Jul. 29, 2014.

(51) Int. Cl.
| | |
|---|---|
| *B29C 43/24* | (2006.01) |
| *C08J 9/228* | (2006.01) |
| *C08K 3/36* | (2006.01) |
| *C08J 9/16* | (2006.01) |
| *C08F 214/22* | (2006.01) |
| *D01F 6/32* | (2006.01) |
| *B01D 71/32* | (2006.01) |
| *B01D 71/34* | (2006.01) |
| *B29C 55/00* | (2006.01) |
| *H01L 41/193* | (2006.01) |
| *H01L 41/45* | (2013.01) |
| *B01D 71/76* | (2006.01) |
| *B29C 43/00* | (2006.01) |
| *B29K 27/12* | (2006.01) |
| *B29C 55/02* | (2006.01) |
| *B29K 27/00* | (2006.01) |
| *B29K 105/16* | (2006.01) |
| *B29K 105/00* | (2006.01) |
| *B29L 31/00* | (2006.01) |
| *B01D 71/36* | (2006.01) |

(52) U.S. Cl.
CPC .............. *C08K 3/36* (2013.01); *B01D 71/32* (2013.01); *B01D 71/34* (2013.01); *B01D 71/76* (2013.01); *B29C 43/003* (2013.01); *B29C 43/24* (2013.01); *B29C 55/005* (2013.01); *C08F 214/22* (2013.01); *C08J 9/16* (2013.01); *C08J 9/228* (2013.01); *D01F 6/32* (2013.01); *H01L 41/193* (2013.01); *H01L 41/45* (2013.01); *B01D 71/36* (2013.01); *B29C 55/02* (2013.01); *B29K 2027/12* (2013.01); *B29K 2027/16* (2013.01); *B29K 2105/16* (2013.01); *B29K 2105/25* (2013.01); *B29L 2031/755* (2013.01); *C08J 2327/16* (2013.01)

(58) Field of Classification Search
CPC ........ B01D 71/32; B01D 71/34; B01D 71/76; B01D 71/36; B29C 43/003; B29C 43/24; B29C 55/005; B29C 55/02; C08F 214/22; C08J 9/16; C08J 9/228; C08J 2327/16; C08K 3/36; D01F 6/32; H01L 41/193; H01L 41/45; B29K 2027/12; B29K 2027/16; B29K 2105/16; B29K 2105/25; B29L 2031/755
See application file for complete search history.

(56) References Cited

U.S. PATENT DOCUMENTS

| | | | |
|---|---|---|---|
| 4,238,571 A | 12/1980 | Mano et al. | |
| 4,369,391 A * | 1/1983 | Micheron | H01L 41/087 174/117 F |
| 4,668,449 A * | 5/1987 | Soni | H01L 41/257 252/62.9 R |
| 4,737,526 A | 4/1988 | Mukalyama et al. | |
| 5,071,609 A | 12/1991 | Tu et al. | |
| 5,432,396 A * | 7/1995 | Sato | B06B 1/0648 310/334 |
| 7,455,772 B2 | 11/2008 | Tada et al. | |
| 2006/0148912 A1 | 7/2006 | Katsurao et al. | |
| 2009/0203864 A1 * | 8/2009 | Amin-Sanayei | C08F 14/18 526/216 |

FOREIGN PATENT DOCUMENTS

| | | |
|---|---|---|
| EP | 0 118 757 | 9/1984 |
| EP | 090 8487 | 4/1999 |

(Continued)

OTHER PUBLICATIONS

Bolbasov, E.M et al., Ferroelectric polymer scaffolds based on a copolymer of tetrafluoroethylene with vinylidene fluoride: Fabrication and properties, Materials Science and Engineering C 40 (2014) pp. 32-41.

(Continued)

*Primary Examiner* — Irina S Zemel
(74) *Attorney, Agent, or Firm* — Amy L. Miller

(57) ABSTRACT

VDF-co-(TFE or TrFE) polymers having a molecular weight of at least about 1,000,000 g/mol and a melt temperature less than about 240° C. The VDF copolymer contains at least about 50 mol % VDF monomer and may include an amount of at least one other monomer. The VDF copolymer may be used to form a membrane that has a node and fibril structure. The membrane has a percent porosity of at least 25%. A VDF-co-(TFE or TrFE) polymer membrane may be formed by lubricating the VDF copolymer, subjecting the lubricated polymer to pressure at a temperature below the melting point of the VDF copolymer to form a preform material, and expanding the preform material at a temperature below the melting temperature of the VDF copolymer. Dense VDF copolymer articles, filled VDF copolymer membranes, and VDF copolymer fibers are also provided.

11 Claims, 10 Drawing Sheets

(56) References Cited

FOREIGN PATENT DOCUMENTS

| JP | 59-146818 | * | 8/1984 |
|---|---|---|---|
| JP | 2012512947 | | 6/2012 |
| WO | 2010/107494 | | 9/2010 |

OTHER PUBLICATIONS

Stefanou, H., The Application of a Dipolar Theory to the Piezoelectricsity in Vinylidene Fluoride-co-tetrafluoroethylene Polymers, Penwalt Corp, King of Prussia PA Central Research, N00014-77-C-0130, Technical Report No. 1, Mar. 1978, 29 pages.

Weber, N. et al,Characterization and in vitro cytocomoatibility of piezoelecric eiectrospun scaffolds, Acta Biometerials 6 (2010) pp. 3550-3556.

* cited by examiner

ARTICLES PRODUCED FROM VDF-CO-(TFE OR TRFE) POLYMERS

FIELD

The present invention relates generally to VDF-co-(TFE or TrFE) polymers, and more specifically to porous articles containing VDF-co-(TFE or TrFE) polymers where the articles have a node and fibril microstructure and a melt temperature less than about 240° C. A process for the formation of porous articles from VDF-co-(TFE or TrFE) polymers is also provided.

BACKGROUND

It is known in the art that microporous fluoropolymer membranes are useful in a variety of applications. Articles made from microporous fluoropolymer membranes possess properties such as toughness, impact strength, abrasion resistance, low coefficient of friction, gamma resistance, and resistance to attack by solvents and corrosive chemicals. Because of the favorable attributes associated with microporous fluoropolymer membranes, microporous fluoropolymer membranes have been utilized in a variety of applications, such as water filtration, dialysis, battery separators, vents, desalinization, and gas separation.

Of the numerous microporous fluoropolymer membranes in existence, polyvinylidene fluoride (PVDF and PVDF copolymer) membranes possess excellent chemical resistance, heat resistance, and radiation resistance. Copolymers of PVDF are also used in piezoelectric and electrostrictive applications. PVDF membranes are conventionally formed by a solvent induced phase separation or a thermally induced phase separation method. However, such conventional processes possess undesirable features or attributes, such as, for example, requiring high solvent levels and processing above the melt temperature of the PVDF polymer. In addition, conventional processes result in a mechanically weak and/or costly article.

Thus, there exists a need in the art for a process for making a PVDF copolymer article that is processed without solvent and below the melting temperature, has high strength, and is highly porous.

SUMMARY

One embodiment relates to a process for making a vinylidene fluoride (VDF) copolymer article that includes (1) lubricating a VDF copolymer having a molecular weight of at least about 1,000,000 g/mol and about 50 mol % to about 85 mol % VDF monomers to form a lubricated VDF copolymer, (2) subjecting the lubricated VDF copolymer to pressure at a temperature below the melt temperature of the VDF copolymer to form a preform, and (3) expanding the preform at a temperature below the melt temperature of the VDF copolymer to form a porous article having a structure of nodes interconnected by fibrils. In one embodiment, the lubricated VDF copolymer may be calendered or ram extruded at a temperature that is about 80° C. or less below the melt temperature of the VDF copolymer.

A second embodiment relates to a process for manufacturing thin, strong porous articles that includes (1) subjecting a lubricated vinylidene fluoride (VDF) copolymer to pressure and heat below the melt temperature of the VDF copolymer to form a preform article. The preform article is then expanded below the melt temperature of the VDF copolymer to form a porous article. The porous article has a microstructure of nodes interconnected by fibrils. In one embodiment, the lubricated VDF copolymer may be calendered or ram extruded at a temperature that is about 80° C. or less below the melt temperature of the VDF copolymer.

A third embodiment relates to a porous article that includes an expanded vinylidene fluoride (VDF) copolymer membrane having a microstructure of nodes interconnected by fibrils. The VDF copolymer has a molecular weight from about 1,000,000 g/mol to about 100,000,000 g/mol and includes at least about 50 mol % VDF monomers. The melt temperature of the VDF copolymer is less than about 240° C. The VDF copolymer membrane has a porosity of at least about 25%. In one or more exemplary embodiments, the VDF copolymer includes one or more comonomer in an amount from about 0.001 mol % to about 10 mol %.

A fourth embodiment relates to a porous article that includes an expanded vinylidene fluoride (VDF) copolymer membrane that has a microstructure of nodes interconnected by fibrils. The VDF copolymer may have less than about 65 mol % VDF monomers. The VDF copolymers have a melt temperature less than about 240° C. Additionally, the VDF copolymers may include at least one comonomer in an amount from about 0.001 mol % to about 10 mol %. The VDF copolymer membrane has a porosity of at least about 25% and a matrix tensile strength of at least about 55 MPa in at least one direction.

A fifth embodiment relates to a preform article that includes a cohesive non-expanded vinylidene fluoride (VDF) copolymer. The VDF copolymer includes less than about 65 mol % VDF monomers. Additionally, the VDF copolymer may include at least one comonomer in an amount from about 0.001 mol % to about 10 mol %. Further, the VDF copolymer has a melt temperature less than about 240° C.

A sixth embodiment relates to a porous article that includes a porous vinylidene fluoride (VDF) copolymer membrane that has a node and fibril structure. The VDF copolymer has a molecular weight of at least about 1,000,000 g/mol. The VDF copolymer membrane has a first endotherm associated with a melting temperature of the VDF copolymer and a second endotherm associated with a node and fibril structure. Neither the first endotherm nor the second endotherm exceeds 240° C. Also, the VDF copolymer has a matrix tensile strength of at least 65 MPa in at least one direction. The VDF copolymer may include at least one comonomer in an amount from about 0,001 mol % to about 10 mol %.

A seventh embodiment relates to a porous article formed from a VDF copolymer that has at least about 50 mol % VDF monomers. The porous article has a microstructure of nodes interconnected by fibrils, a first endotherm associated with a melting temperature of the VDF copolymer and a second endotherm associated with a node and fibril structure that is at least 10° C. higher than the melting temperature. Both the first and the second endotherms are below 240° C. The VDF copolymer has a molecular weight from about 1,000,000 g/mol and about 100,000,000 g/mol. In addition, the VDF copolymer may include at least one comonomer in an amount from about 0.001 mol % to about 10 mol %.

An eighth embodiment relates to a filled VDF copolymer article that includes a VDF-co-(TFE or TrFE) polymer having a melt temperature less than about 240° C., a molecular weight (MW) of at least about 1,000,000 g/mol, and at least one filler material. The filler material may be present in an amount from about 1% to about 80% based on the total weight of the filled VDF copolymer article. In one exemplary embodiment, the VDF copolymer article has a porosity less than about 10%.

A ninth embodiment relates to a process for making a dense article that includes calendering a VDF copolymer (e.g., without a lubricant) to form a dense VDF-TFE article. The VDF copolymer has a molecular weight from about 1,000,000 g/mol to about 100,000,000 g/mol and a melt temperature less than about 240° C.

A tenth embodiment relates to a dense article that includes a vinylidene fluoride (VDF) copolymer membrane that has a porosity less than about 10%. The VDF copolymer has a molecular weight from about 1,000,000 g/mol to about 100,000,000 g/mol. In at least one embodiment, the VDF copolymer includes at least about 50 mol % VDF monomers.

An eleventh embodiment relates to a process for making a vinylidene fluoride (VDF) copolymer fiber that includes (1) lubricating a VDF copolymer having a molecular weight of at least about 1,000,000 g/mol to form a lubricated VDF copolymer, (2) subjecting the lubricated VDF copolymer to pressure at a first temperature below the melt temperature of the VDF copolymer to form a preform, (3) slitting the preform in a length direction, and (4) stretching the slit preform into a VDF copolymer fiber at a second temperature that is below the melt temperature of the VDF copolymer.

A twelfth embodiment relates to a VDF copolymer fiber that includes a VDF-co-(TFE or TrFE) polymer having a melt temperature less than about 240° C. and a molecular weight of at least about 1,000,000 g/mol.

A thirteenth embodiment relates to a method of making an expanded vinylidene fluoride (VDF) copolymer article that includes (1) calendering a VDF copolymer having a molecular weight of at least about 1,000,000 g/mol and about 50 mol % to about 85 mol % VDF monomers in the absence of a lubricant and at a first temperature less than the melting temperature of said VDF copolymer to form a dense VDF copolymer article and (2) expanding the dense article at a second temperature less than the melting temperature of said VDF copolymer to form an expanded VDF copolymer article (e.g., an expanded VDF tape or expanded VDF film).

A fourteenth embodiment relates to a vinylidene fluoride (VDF) copolymer resin that includes a random VDF copolymer containing from about 50 mol % to about 85 mol % VDF and having a molecular weight of at least about 1,000,000 g/mol and a melt temperature less than about 240° C. The VDF copolymer has a molecular weight from about 1,000,000 g/mol to about 100,000,000 g/mol. The VDF copolymer resin may include at least one comonomer in an amount from about 0.001 mol % to about 10 mol %. In at least one embodiment, the VDF copolymer includes TFE or TrFE.

BRIEF DESCRIPTION OF THE DRAWINGS

The accompanying drawings are included to provide a further understanding of the disclosure and are incorporated in and constitute a part of this specification, illustrate embodiments, and together with the description serve to explain the principles of the disclosure.

GLOSSARY

Figure 1:
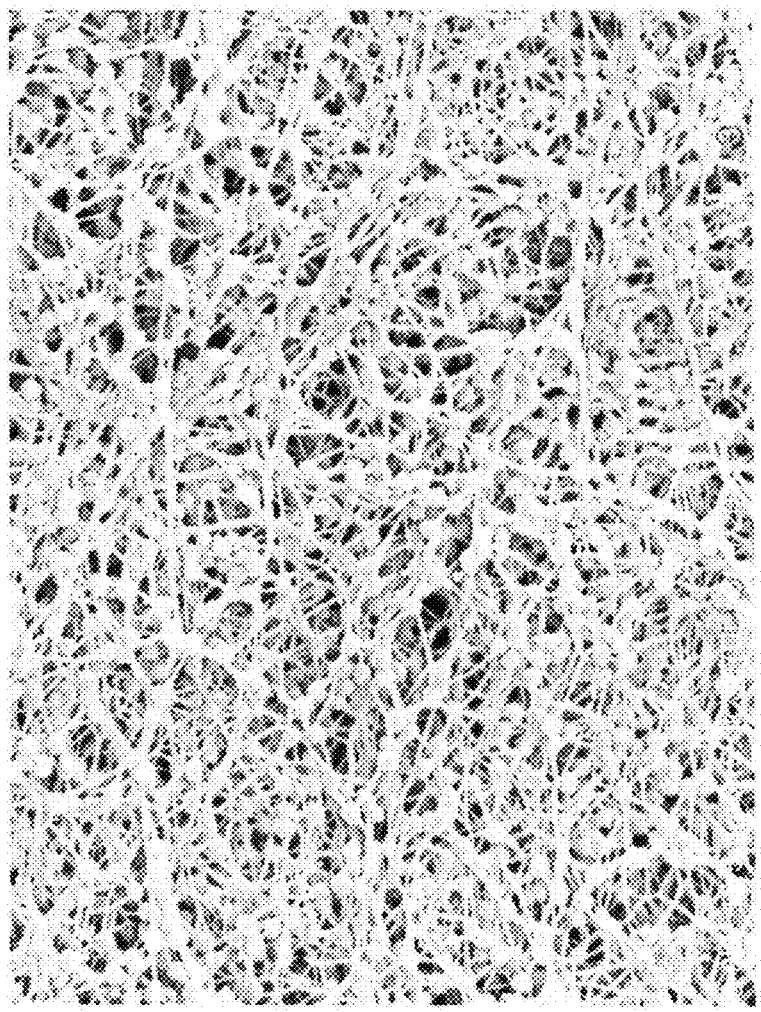
FIG. 1 is a scanning electron micrograph (SEM) of the surface of the non-expanded flexible cohesive tape of Example 3 taken at 15,000× magnification in accordance with an embodiment.

As used herein, the term "VDF" refers to vinylidenefluoride.

As used herein, the term "TFE" refers to tetrafluoroethylene.

As used herein, the term "TrFE" refers to trifluoroethylene.

As used herein, the term "lubricant" is meant to describe a processing aid that includes, and in some embodiments, consists of, an incompressible fluid that is not a solvent for the polymer at processing conditions. The fluid-polymer surface interactions are such that it is possible to create a homogenous mixture.

As used herein, the terms "melting point", "melt temperature", and "melting temperature" are meant to define the peak of the melt endotherm as measured by differential scanning calorimetry (DSC) during the first heating of the VDF copolymer.

As used herein, the term "dense" is meant to describe a VDF copolymer membrane, preform, or article that has a porosity of less than about 10%.

As used herein, a node may be described as a larger volume of polymer, and is where a fibril originates or terminates with no clear continuation of the same fibril through the node. A fibril may have a width of less than about 250 nm, or less than about 150 nm.

As used herein, the term "cohesive" is meant to describe a tape or precursor material that is sufficiently strong for further processing.

As used herein, the term "uniaxial" is meant to describe a polymer, membrane, preform, or article that is expanded in only one direction.

As used herein, the term "biaxial" is meant to describe a polymer, membrane, preform, or article that is expanded in at least two directions.

DETAILED DESCRIPTION

Persons skilled in the art will readily appreciate that various aspects of the present disclosure can be realized by any number of methods and apparatus configured to perform the intended functions. It should also be noted that the accompanying figures referred to herein are not necessarily drawn to scale, but may be exaggerated to illustrate various aspects of the present disclosure, and in that regard, the figures should not be construed as limiting.

It is to be noted that the term "VDF-co-(TFE or TrFE) polymers" is used interchangeably with "VDF copolymers" in this application. It is also to be noted that all VDF-co-(TFE or TrFE) polymers described herein are random copolymers. In addition, the terms "melting temperature", "melt temperature", and "melting point" are used interchangeably herein.

The invention relates to VDF-co-(TFE or TrFE) polymers that have a melt temperature less than about 240° C. and a molecular weight (Mw) of at least about 1,000,000 g/mol. The VDF copolymers may include at least about 50 mol % VDF monomers. A comonomer other than TFE monomer and TrFE monomer may be included in the VDF copolymer. The TFE or TrFE monomers are randomly positioned within the VDF-co-(TFE or TrFE) polymers. Articles made from the VDF-co-(TFE or TrFE) polymers have a node and fibril microstructure and no reversible melt temperature greater than about 240° C.

The VDF-co-(TFE or TrFE) polymers have a molecular weight (Mw) from about 1,000,000 g/mol to about 100,000,000 g/mol, from about 1,000,000 g/mol to about 50,000,000 g/mol, from about 1,000,000 g/mol to about 25,000,000 g/mol, from about 1,000,000 g/mol to about 20,000,000 g/mol, from about 1,000,000 g/mol to about 15,000,000 g/mol, from about 1,000,000 g/mol to about 10,000,000 g/mol, or from about 1,000,000 g/mol to about 5,000,000 g/mol. Additionally, the VDF-co-(TFE or TrFE) polymers contain at least about 50 mol % VDF monomer, at least about 55 mol % VDF monomer, at least about 60 mol % VDF monomer, at, least about 65 mol % VDF monomer, at least about 70 mol % VDF monomer, at least about 75 mol % VDF monomer, at least about 80 mol % VDF monomer, or at least about 85 mol % VDF monomer. The VDF monomer may also be present in the VDF copolymer in an amount from about 50 mol % to about 85 mol %, from about 50 mol % to about 80 mol %, from about 50 mol % to about 75 mol %, from about 50 mol % to about 70 mol %, from about 50 mol % to about 65 mol %, or from about 50 mol % to about 60 mol %. In some embodiments, the VDF copolymer may include less than about 85 mol % VDF monomer, less than about 75 mol % VDF monomer, less than about 65 mol % VDF monomer, less than about 60 mol % VDF monomer, or less than about 55 mol % VDF monomer.

Additionally, the VDF-co-(TFE or TrFE) polymers may optionally contain at least one other monomer. Suitable comonomers that may be included in the VDF copolymer include, but are not limited to, ethylene, propylene, isobutylene, fluorinated comonomers such as chlorotrifluoroethylene (CTFE), hexafluoropropylene (HFP), vinylidene difluoride ($CF_2=CH_2$), hexafluoroisobutylene (HFIB), fluorodioxoles, fluorodioxalanes, perfluoroalkyl ethylene monomers (e.g. perfluorobutylethylene (PFBE), perfluorohexylethylene (PFHE) and perfluorooctylethylene (PFOE)), and a perfluoroalkyl vinyl ether monomer (e.g., perfluoro(methyl vinyl ether) (PMVE), perfluoro(ethyl vinyl ether) (PEVE), and perfluoro(propyl vinyl ether) (PPVE)). The optional comonomer(s) may be present in the VDF-co-(TFE or TrFE) polymers in an amount from about 0.001 mol % to about 10 mol %, from about 0.01 mol % to about 7 mol %, or from about 0.1 mol % to about 5 mol %.

Figure 2:
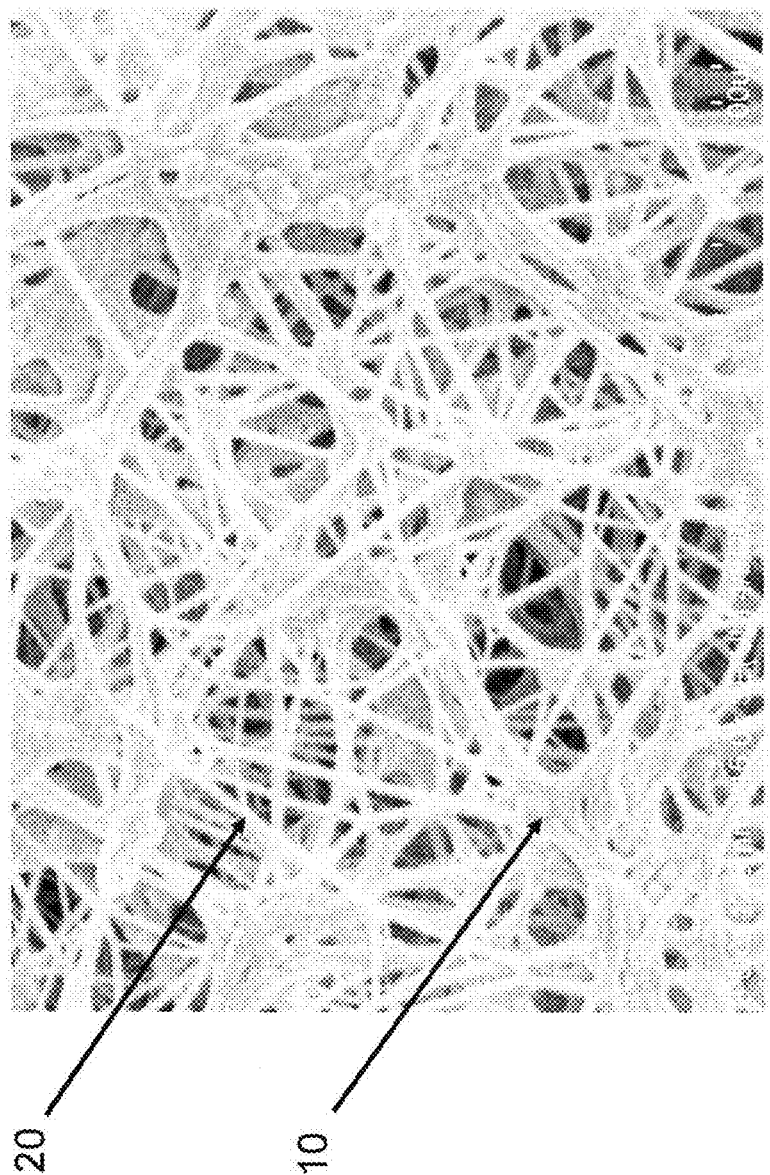
FIG. 2 is a scanning electron micrograph (SEM) of the surface of the expanded VDF-TFE copolymer membrane of Example 4 taken at 15,000× magnification according to at least one embodiment.
Figure 3:
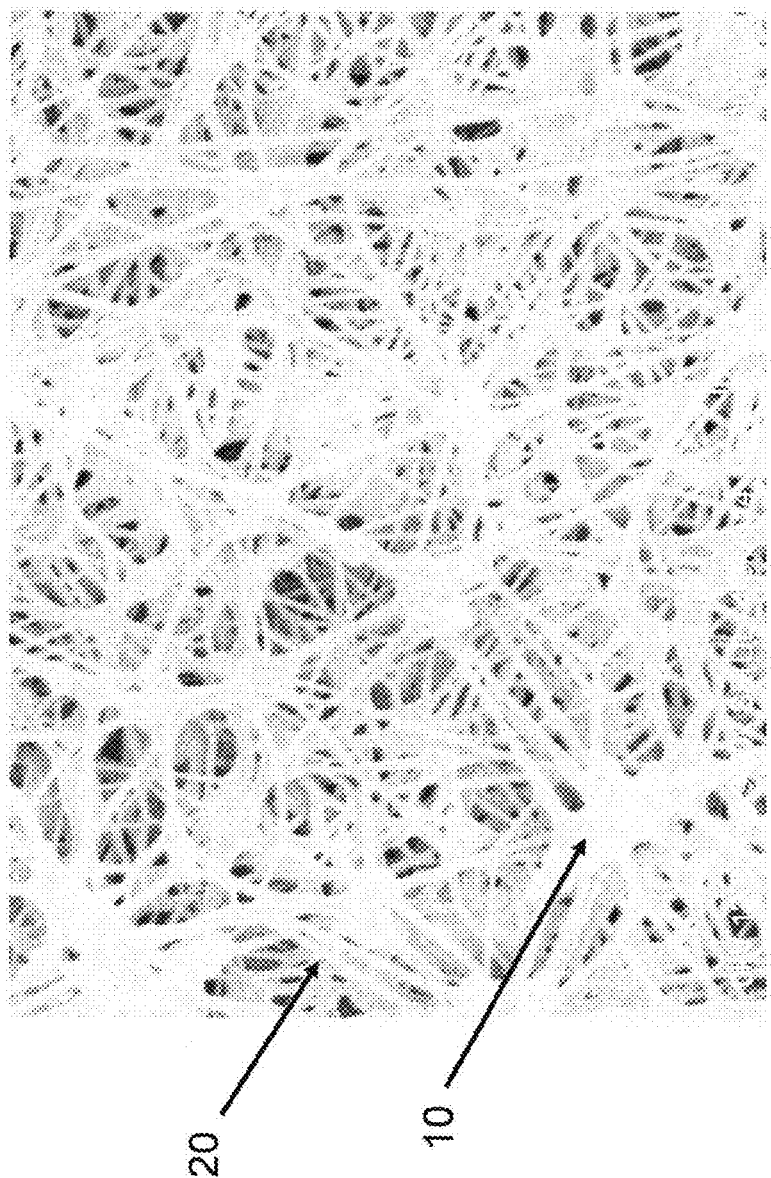
FIG. 3 is scanning electron micrograph (SEM) of the surface of the expanded VDF-TFE copolymer membrane of Example 5 taken at 9,000× magnification in accordance with an embodiment.

Each of the VDF-co-(TFE or TrFE) polymers described herein (i.e., VDF-TFE copolymers and VDF-TrFE copolymers) have a melting temperature that falls within the range from about 120° C. to about 240° C. or from about 120° C. to about 200° C. In at least one exemplary embodiment, the VDF copolymer has a melting temperature less than about 240° C. When the VDF copolymer is formed into a membrane, the VDF copolymer membrane has a microstructure of nodes 10 interconnected by fibrils 20, as can be seen in FIGS. 2 and 3. As used herein, a node may be described as a larger volume of polymer, and is where a fibril originates or terminates with no clear continuation of the same fibril through the node. A fibril may have a width of less than about 250 nm, or less than about 150 nm.

In addition, the VDF-co-(TFE or TrFE) copolymer membranes have a percent porosity that is greater than about 10% greater than or equal to about 15%, greater than or equal to about 20%, greater than or equal to about 25%, greater than or equal to about 30%, greater than or equal to about 35%, greater than or equal to about 40%, greater than or equal to about 45%, greater than or equal to about 50%, greater than or equal to about 55%, greater than or equal to about 60%, greater than or equal to about 65%, greater than or equal to about 70%, greater than or equal to about 75%, greater than or equal to about 80%, greater than or equal to about 85%, or up to (and including) 90%. In exemplary embodiments, the VDF copolymer membranes may have a percent porosity from about 25% to about 90%, from about 40% to about 90%, from about 50% to about 90%, or from about 60% to about 90%.

In forming a porous article from a VDF-co-(TFE or TrFE) polymer, the VDF copolymer is first mixed with a lubricant, such as a light mineral oil. Other suitable lubricants include aliphatic hydrocarbons, aromatic hydrocarbons, halogenated hydrocarbons, and the like, and are selected according to flammability, evaporation rate, and economic considerations. It is to be appreciated that the term "lubricant", used herein, is meant to describe a processing aid that includes (or consists of) an incompressible fluid that is not a solvent for the polymer at the process conditions. The fluid-polymer surface interactions are such that it is possible to create a homogenous mixture. It is also to be noted that that choice of lubricant is not particularly limiting and the selection of lubricant is largely a matter of safety and convenience. The lubricant may be added to the VDF-co-(TFE or TrFE) polymers in an amount from about 1 ml/100 g to about 100 ml/100 g or from about 10 ml/100 g to about 70 ml/100 g.

In at least one embodiment, the VDF copolymer and lubricant are mixed so as to uniformly or substantially uniformly distribute the lubricant in the mixture. It is to be appreciated that various times and mixing methods may be used to distribute the VDF copolymer in the mixture. Once blended, VDF copolymer/lubricant mixture is in a paste-like state. The VDF-co-(TFE or TrFE) polymer can be formed into solid shapes (e.g. fibers, tubes, tapes, sheets, three dimensional self-supporting structures, etc.) without exceeding the melt temperature of the VDF copolymer. In at least one embodiment, the lubricated VDF copolymer is heated to a point below the melting temperature of the VDF copolymer and with the application of sufficient pressure and shear to form inter-particle connections, a solid form is created. Non-limiting examples of methods of applying pressure and shear include ram extrusion (e.g., typically called paste extrusion or paste processing when lubricant is present) and calendering.

In one exemplary embodiment, the lubricated VDF copolymer is ram extruded to produce a cohesive, flexible tape. As used herein, the term "cohesive tape" is meant to describe a tape that is sufficiently strong for further processing. The ram extrusion occurs below the melting temperature of the VDF-co-(TFE or TrFE) polymer. In at least one alternate embodiment, the lubricated VDF copolymer may be calendered at a temperature below the melting temperature of the VDF copolymer to produce a cohesive, flexible tape. These cohesive, flexible tapes are referred hereafter simply as "tape".

In exemplary embodiments, the ram extrusion (or, alternatively, calendering) occurs below the melting point of the VDF copolymer, such as, for example, about 80° C. below the melting point of the VDF copolymer, about 70° C. below the melting point, about 60° C. below the melting point, about 50° C. below the melting point, about 40° C. below the melting point, about 30° C. below the melting point, about 25° C. below the melting point, about 15° C. below the melting point, about 10° C. below the melting point, about 5° C. below the melting point, or about 1° C. below the melting point. The tape thus formed has an indeterminate length and a thickness less than about 1 mm. Tapes may be formed that have a thickness from about 0.01 mm to about 1 mm, from about 0.08 mm to about 0.5 mm, or from 0.05 mm to 0.2 mm, or even thinner. In exemplary embodiments, the tape has a thickness from about 0.05 mm to about 0.2 mm.

In a subsequent step, the lubricant may be removed from the tape. In instances where a mineral oil is used as the lubricant, the lubricant may be removed by washing the tape in hexane or other suitable solvent. The wash solvent is chosen to have excellent solubility for lubricant and sufficient volatility to be removed below the melting point of the VDF copolymer. If the lubricant is of sufficient volatility, the lubricant may be removed without a washing step, or it may be removed by heat and/or vacuum. The tape is then optionally permitted to dry, typically by air drying. However, any conventional drying method may be used as long as the temperature of heating the sample remains below the melting point of the VDF-co-(TFE or TrFE) polymer.

The tapes, once dried, may be cut to suitable sizes for expansion. Expansion of these samples occurs at temperatures below the melt temperature of the VDF-co-(TFE or TrFE) polymer and above ambient temperature. In at least one exemplary embodiment, expansion occurs at least about 80° C. below the melting point of the VDF copolymer, at least about 70° C. below the melting point, at least about 60° C. below the melting point, at least about 50° C. below the melting point, at least about 45° C. below the melting point, at least about 40° C. below the melting point, at least about 35° C. below the melting point, at least about 30° C. below the melting paint, at least about 25° C. below the melting point, at least about 20° C. below the melting point, at least about 15° C. below the melting point, at least about 10° C. below the melting point, at least about 5° C. below the melting point, at a temperature less than about 5° C. below the melting point, or at a temperature less than about 1° C. below the melting point. The samples may be expanded in one or more direction to form a porous membrane. Expansion, either uniaxial or biaxial, may be conducted at rates up to about 1,000%/second, up to about 5,000%/second, up to about 10,000%/second, or from about 1%/second to about 5,000%/second or from about 1%/second to about 10,000%/second. It has been discovered that an increase in strength concurrently occurs upon expansion. The increase in strength of the polymer matrix is dependent upon the strength of the tape prior to expansion, the quality of the resin (e.g., particle size, molecular weight, distribution of particle size and/or molecular weight, degree of crystallinity, composition of polymer, and the like), the temperature at which expansion is performed, the rate of expansion, and/or the total amount of expansion. The VDF-co-(TFE or TrFE) polymer membranes have a matrix tensile strength in at least one direction greater than about 55 MPa, or from about 55 MPa to about 3000 MPa.

The expanded VDF copolymer membrane has a structure of nodes 10 interconnected by fibrils 20, such as may be seen in FIGS. 2 and 3. The porous microstructure of the expanded membrane is affected by the temperature, the total amount of expansion, and the rate at which it is expanded. The geometry of the nodes and fibrils can be controlled by the selection of VDF copolymer, the rate of expansion, temperature of expansion, and/or ultimate expansion ratio.

In addition, the incorporation of filler materials in various forms within the VDF copolymer membranes is considered to be within the purview of the invention. VDF copolymers, together with one or more filler materials, may be used to form a VDF membrane or article, such as described above. Non-limiting examples of suitable filler materials include carbon black, aerogels, metals, semi-metals, ceramics, carbon/metal particulate blends, activated carbon, silica, ferroelectric particles, and combinations thereof. Filler materials may be incorporated into the VDF copolymer membrane or article in amounts from about 1.0% to about 80%, from about 20% to about 60%, or from about 1% to about 30% by weight of the membrane/article. The filler materials may be incorporated into the VDF copolymer membrane or article by conventional methods, such as, but not limited to, those described in U.S. Pat. No. 4,985,296 to Mortimer, Jr.

In one embodiment, a VDF copolymer membrane may be compressed (with or without the application of heat and with or without the presence of a lubricant) to form a dense article. A VDF copolymer article is considered to be a dense VDF copolymer article if the porosity of the VDF copolymer article is less than about 10%. Additionally, a VDF copolymer dense article may be subsequently expanded to form an expanded (dense) VDF copolymer article.

In another embodiment, a VDF copolymer may be compressed (with or without the application of heat) and without the addition of a lubricant to form a dense VDF copolymer article. Such a dense VDF copolymer article may optionally be expanded in one or more direction to form an expanded VDF copolymer article.

Additionally, a VDF copolymer preform can be formed into a fiber by slitting the preform in the machine direction (length direction) and subsequently stretching the slit preform to form a VDF copolymer fiber.

In another embodiment, a VDF copolymer may be calendered to form a dense VDF copolymer article and subsequently expanded to form an expanded VDF copolymer article (e.g., an expanded VDF tape or expanded VDF film). In at least one embodiment, the expanded VDF copolymer article includes at least about 50 mol % VDF and at least about 50 mol % TFE or TrFE.

TEST METHODS

It should be understood that although certain methods and equipment are described below, other methods or equipment determined suitable by one of ordinary skill in the art may be alternatively utilized. It is to be understood that the following examples were conducted on a lab scale but could be readily adapted to a continuous or semi-continuous process.

Bubble Point Measurements

The Bubble Point was measured according to the procedures of ASTM F316-86. Isopropyl alcohol was used as the wetting fluid to fill the pores of the test specimen. The reported value represents the average measurements for two samples.

The Bubble Point is the pressure of air required to displace the isopropyl alcohol from the largest pores of the test specimen and create the first continuous stream of bubbles detectable by their rise through a layer of isopropyl alcohol covering the porous media. This measurement provides an estimation of maximum pore size.

Gurley Air Flow

The Gurley air flow test measures the time in seconds for 100 cm$^3$ of air to flow through a 645 cm$^2$ sample at 12.4 cm of water pressure. The samples were measured in a Gurley Densometer Model 4340 Automatic Densometer. The reported results are the average of two measurements.

SEM Method

The SEM samples were imaged at 1.0 to 3.0 kV using an Hitachi SU 8000 Field Emission scanning electron microscope with mixed Upper and Lower Second Electron detectors.

Thickness Measurements

Thickness was measured by placing the sample between the two plates of a Miyutoyo thickness gauge (Miyutoyo Corporation, Kawasaki, Japan). The average of multiple measurements was reported.

Percent Porosity Calculation

Pycnometry was used to determine the true density of the VDF copolymer. Density was used to calculate the percent porosity of expanded materials using 1.95 g/cc as the true density of the sample. Samples were die cut to form rectangular sections 9.05 cm by 5.08 cm. Each sample was weighed using a AND Model HF 400 balance, and then the thickness of the samples was taken using a Miyutoyo thickness gauge (Miyutoyo Corporation, Kawasaki, Japan). Using this data, the bulk density of the sample can be calculated with the following formula:

$$\rho_{bulk} = \frac{m}{w * l * t}$$

where: $\rho_{bulk}$=bulk density (g/cc)
m=mass (g)
w=width (9.05 cm)
l=length (5.08 cm)
t=thickness (cm).

The reported results are the average of at least three calculations. Porosity was calculated as:

$$P = 100 \cdot \left(1 - \frac{\rho_{bulk}}{\rho}\right)$$

where: P=% porosity
$\rho_{bulk}$=bulk density of the sample (g/cc)
$\rho$=true density Matrix Tensile Strength (MTS)

Tensile break load was measured using an INSTRON 5565 tensile test machine. Test parameters: ASTM Standard.638: Dogbone sample of dimensions: Die: 638-5, Gauge Width: 0.3175 cm. Gauge Length: 0.9525 cm, Grip Length: 3.175 cm, Rate: 7.72 cm/min. For longitudinal MTS measurements, the larger dimension of the sample was oriented in the calendering direction, which was designated the "machine direction". For the transverse MTS measurements, the larger dimension of the sample was oriented perpendicular to the calendering direction, which was designated the "transverse direction".

Alternatively, the tensile break load was measured using an INSTRON 5500R tensile test machine equipped with flat-faced grips and a "200 lb" load cell. The gauge length was 19 mm and the cross-head speed was 20.3 cm/min. For longitudinal MTS measurements, the larger dimension of the sample was oriented in the calendering direction, which was designated the "machine direction". For the transverse MTS measurements, the larger dimension of the sample was oriented perpendicular to the calendering direction, which was designated the "transverse direction".

The sample from the density measurement was used for tensile testing. The sample dimensions were 50.8 mm by 12.7 mm. The effective thickness is calculated from the mass, the area, and the density of the sample. Two samples were then tested individually on the tensile tester. The average of the two maximum load (i.e., the peak force) measurements was reported. The longitudinal and transverse MTS were calculated using the following equation:

MTS=(maximum load/cross-section area)*(density of VDF copolymer)/density of the sample), wherein the density of VDF copolymer was taken to be 1.95 g/cc as measured by pyconometry.

Molecular Weight (Mw) Determination for VDF-TFE Copolymer of Example 2

The molecular weight (Mw) of the VDF copolymer was calculated by using the following Equation (1)$^{(Berry, G\ C;\ Fox, T.\ G.\ 1968)}$;

$$\eta_0 = \frac{G_N}{1.7} K_\lambda M w^{3.4} \quad \text{Equation (1)}$$

$\eta_0$ = melt zero – shear viscosity (Pa.s)

$\frac{G_N}{1.7} K_\lambda$ = the front factor, $Ke^{(Wasserman, S.H.;Graessley.W.1996)}$.

Figure 9:
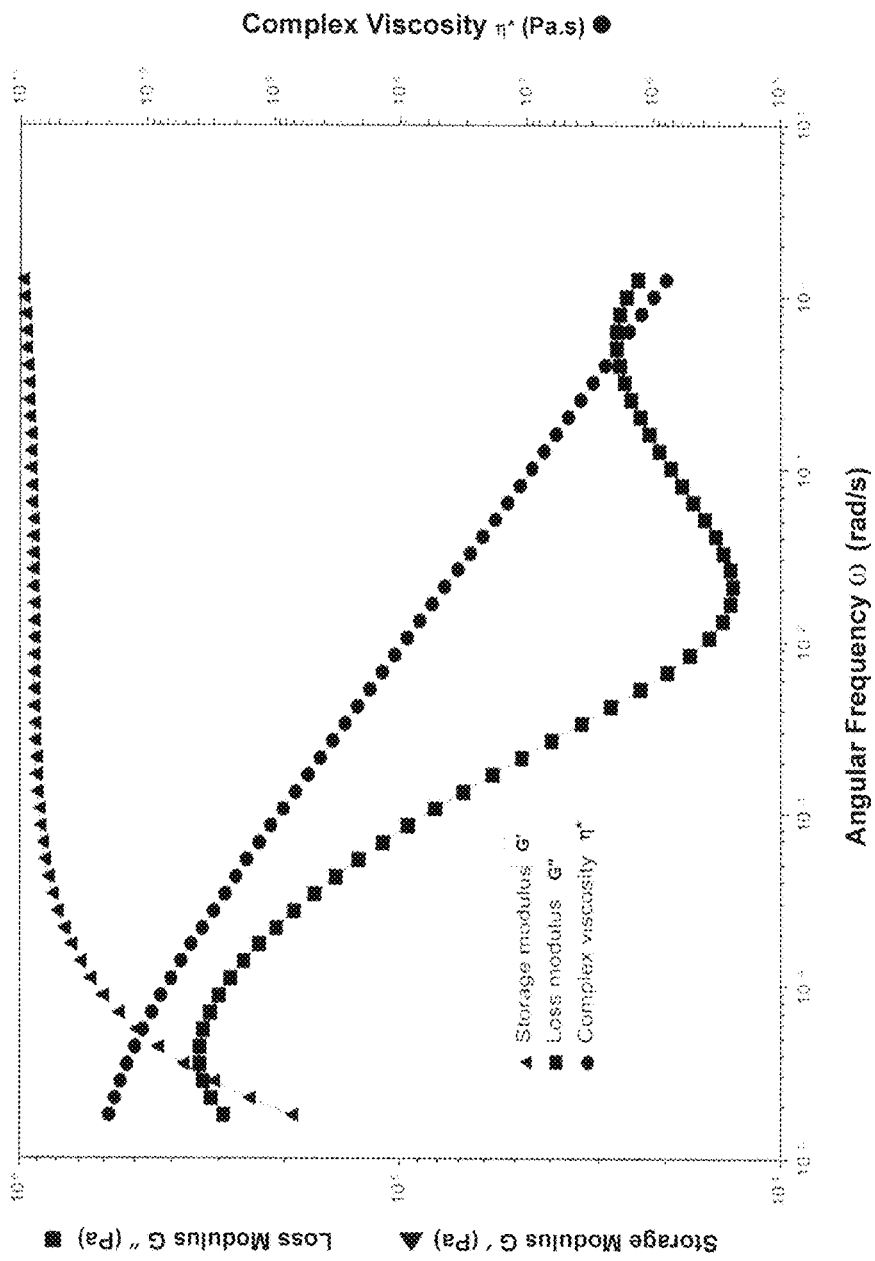
FIG. 9 is an experimental data plot of Complex Viscosity ($\eta^*$), Storage Modulus (G') and Loss Modulus (G") versus Angular Frequency ($\omega$) for the VDF-TFE copolymer of Example 2 in accordance with an embodiment.

$K_\lambda$ = constant front fractor in
  Mw relation to longest relaxation time
  = 4.63e – 19$^{(Carrot, C.;Guillet, J.1997)}$ In Equation (1), the melt zero-shear viscosity, $\eta_0$ and the front factor, Ke were determined from experimental rheology data as follows. The experimental data plot of Complex Viscosity ($\eta^*$), Storage Modulus (G') and Loss Modulus (G") versus Angular Frequency ($\omega$) was generated at 200° C. using the oscillatory frequency sweep method in a strain controlled rheometer (Model: ARES-G2 rheometer, TA Instruments, New Castle Del.). FIG. 9 shows such a plot for the VDF-TFE copolymer of Example 2.

Using the Cox-Merz rule$^{(Cox,\ W.\ P.;\ Merz,\ E.\ H.\ 1958)}$, the experimental data plot of FIG. 9 was transformed mathematically into a plot of Viscosity ($\eta$) versus Shear Rate ($\dot{\gamma}$), also referred to as the Flow Curve. The Flow Curve was then fitted to the Cross flow model to yield the melt zero-shear viscosity according to the following Equation (2)$^{(Cross, M. M. 1965)}$:

$$\frac{\eta - \eta_\infty}{\eta_0 - \eta_\infty} = \frac{1}{1 + (k\dot{\gamma})^n} \quad \text{Equation (2)}$$

$\eta_0$=melt zero-shear viscosity (Pa·s)
$\eta_\infty$=infinite viscosity (Pa·s)
k=consistency (s)
n=power law index.

Figure 10:
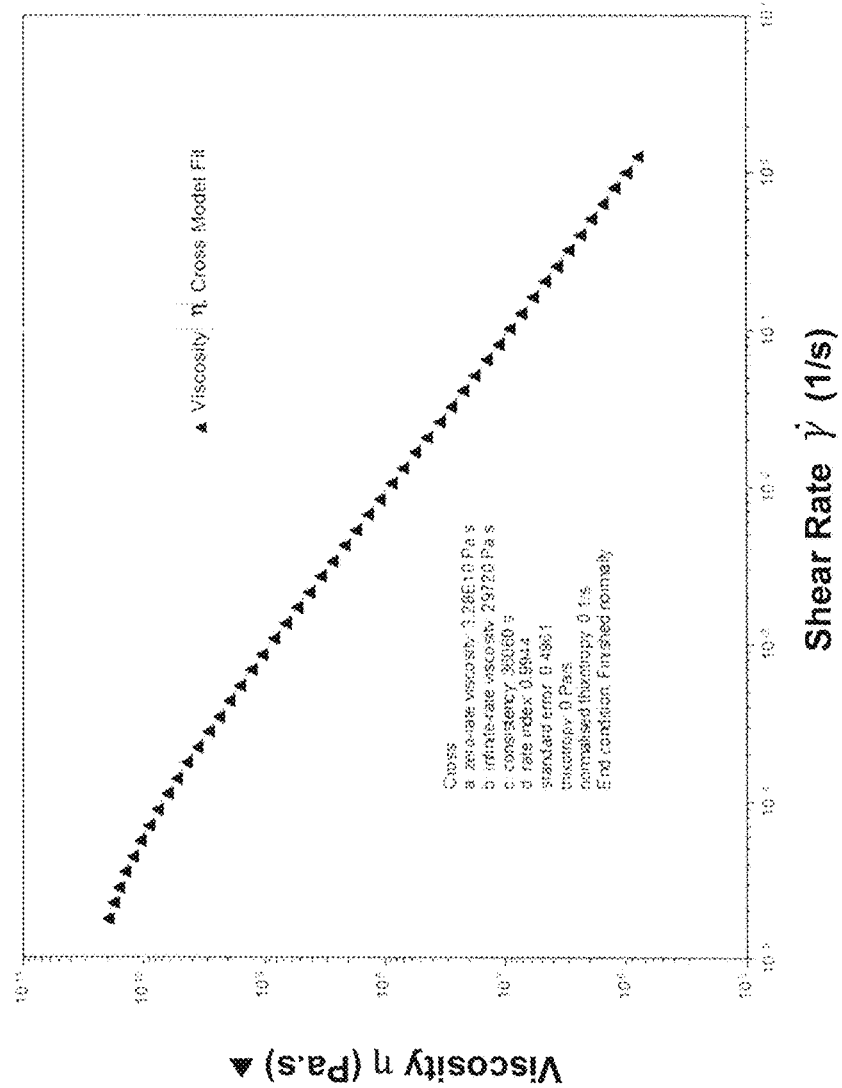
FIG. 10 is a Flow Curve fitted to the Cross flow model for the VDF-TFE copolymer of Example 2 in accordance with an embodiment.

The Flow Curve and the Cross Flow model fit for the VDF-TFE copolymer of Example 2 is shown in FIG. 10. Using the Flow Curie and the Cross flow model fit, the following parameters were calculated from FIG. 10 and reported in Table A.

TABLE A

| | |
|---|---|
| $\eta_0$ | 3.28 E$^{10}$ Pa · s |
| $\eta_\infty$ | 29720 Pa · s |
| k | 36060 s |
| n | 0.9944 |

From FIG. 9, the value of Storage Modulus (G') at an angular frequency of 1 rad/sec was used as the value of $G_N$, which in turn was used in calculating the front factor, Ke. The values for $G_N$ and Ke were determined to be 9.5E05 Pa and 2.59E12, respectively.

Using the above value for Ke and the value for melt zero-shear viscosity from Table A, the molecular weight, Mw of the VDF-TFE copolymer of Example 2 was calculated to be 6,240,000 g/mol.

DSC Measurements

DSC data were collected using a TA Instruments Q2000 DSC between 50° C. and 400° C. using a heating rate of 10° C./min. For resin samples, approximately 5 mg of powder was placed into a standard pan-and-lid combination available from TA instruments. The membrane samples were prepared by punching 4 mm disks. The 4 mm disk was placed flat in the pan and the lid was crimped to sandwich the membrane disk between the pan and lid.

NMR Analysis

The details of the instrument used are provided in Table B. A sample of 10 to 25 mg was packed into a 2.5 mm ZrO spinner using standard Bruker 2.5 mm packing accessories (Bruker BioSpin Inc., Billerica, Md.). $^{19}$F spectra were collected at about 296 Kelvin on a Bruker-BioSpin 2.5 mm cross polarization magic angle spinning (CPMAS) probe positioned in a standard bore 7.05 T Bruker ultra shielded superconducting magnet. The samples were positioned at the magic angle and spun at 28.5 kHz. A Bruker BioSpin Avarice II 300 MHz system was used to collect $^{19}$F NMR data at 282.4 MHz. Software used for data acquisition and data processing was Topspin 1.3. The data was collected using the conditions specified in Table C. The spectra were externally referenced to PTFE at −122 ppm.

TABLE B

| NMR Instrument Used | |
|---|---|
| Manufacturer | Bruker BioSpin |
| Model | Avance II 300 MHz |
| Magnet | 7.05 T Ultrashielded |
| Probe | Bruker 2.5 mm CPMAS Multinuclear |

TABLE B-continued

| NMR Instrument Used | |
|---|---|
| Rotor | Standard Bruker 2.5 mm |
| 19 F Frequency | 282.4 MHz |
| Software | Topspin 1.3 |

TABLE C

| NMR Acquisition Parameters | |
|---|---|
| Parameter | Value |
| MAS Spinning speed | 28.5 kHz |
| Pulse length (11°) | 0.4 micro seconds |
| Spectral Width | 402 PPM |
| Transmitter offset | −100 PPM |
| Number of scans | Greater than 500 |
| Recycle delay | 3 s |
| Acquisition Time | 50 milliseconds |
| Acquired Data Points used in Fourier Transform | 11352 |
| Total data points after Zero Fill | 32k |
| Line broadening | 25 Hz |

EXAMPLES

Example 1

To a 4-liter, polymerization reactor equipped with a 3-bladed agitator was added, 1.65 Kg of deionized (DI) water, 40 g of ammonium perfluorooctanoic acid (APFO) dissolved in 200 ml of water. The reactor was repeatedly evacuated and pressurized (to about 1 Atm or less) with tetrafluoroethylene (TFE) until the oxygen level was reduced to 20 ppm or less.

The reactor was then charged with 2.32 MPa of vinylidene fluoride (VDF) followed by addition of TFE until the pressure reached 2.8 MPa. The reactor was then heated to 70° C., reaching a pressure of 3.6 MPa. The mixture was then agitated at 800 rpm and an ammonium persulfate (APS) in a DI water solution (0.2 g/20 ml) was injected and the reaction pressure started to drop. The reaction pressure continued to drop until the pressure reached 0.8 MPa.

The reaction was then stopped. The reaction time was 99 minutes with a 2.8 MPa pressure drop. The reaction vessel was discharged of its contents. The weight of the dispersion was 2242 g containing 17.5 wt % solids. The dispersion was coagulated with nitric acid and subsequently dried at 120° C.

The raw dispersion particle, size (RDPS) of the VDF-TFE copolymer particle was determined to be 0.89 microns. The VDF monomer concentration in the VDF-TFE copolymer was determined to be 74.1 mol % (64.7 wt %) by NMR. The VDF-TFE copolymer melting point (MP) was determined to be 121.94° C.

Example 2

To a 50-liter, horizontal polymerization reactor equipped with a 3-bladed agitator was added 25 Kg of deionized (DI) water, 200 g of ammonium perfluorooctanoic acid (APFO) water solution, and 5 g of oxalic acid dissolved in about 50 g of DI water. The reactor was repeatedly evacuated and pressurized (to about 0.1 MPa or less) with tetrafluoroethylene (TFE) until the oxygen level was reduced to 20 ppm or less. The contents were briefly agitated at about 60 rpm between evacuation and purge cycles to ensure that the water was deoxygenated.

The reactor was heated to 70° C. and agitated at 60 rpm. Subsequently, 1.84 MPa of VDF were added followed by addition of TFE until the pressure reached 2.8 MPa. At this time, $KMnO_4$ in a deionized (DI) water solution (0.2 g/L) was injected at 80 g/min until approximately 40 g of $KMnO_4$ was added and the reaction pressure started to drop. This rate continued until 0.2 Kg of TFE and 0.08 Kg of VDF were consumed. $KMnO_4$ was added at 40 mL/min for the next 0.2 Kg of TFE and 0.08 Kg of VDF. The $KMnO_4$ was then added at 30 mL/min until 0.2 Kg more of TFE and 0.08 Kg more of VDF were consumed. $KMnO_4$ was then added at 20 g/min until 0.2 Kg more of TFE and 0.08 Kg more of VDF were consumed. The $KMnO_4$ addition was then reduced to 15 g/min for the next 3 Kg of TFE and the next 1.2 Kg of VDF monomers. The total amount of $KMnO_4$ solution added was 0.565 Kg.

VDF and TFE were added sequentially such that for each 0.2 Kg of consumed TFE was followed by 0.08 Kg of VDF until 3.4 Kg of TFE and 2.2 Kg of VDF were consumed and the reaction was stopped.

The total polymerization time was 42 min. The weight of the dispersion produced was 30.98 Kg containing 16.82% solids. The dispersion was coagulated with nitric acid and dried at 130° C.

Figure 5:
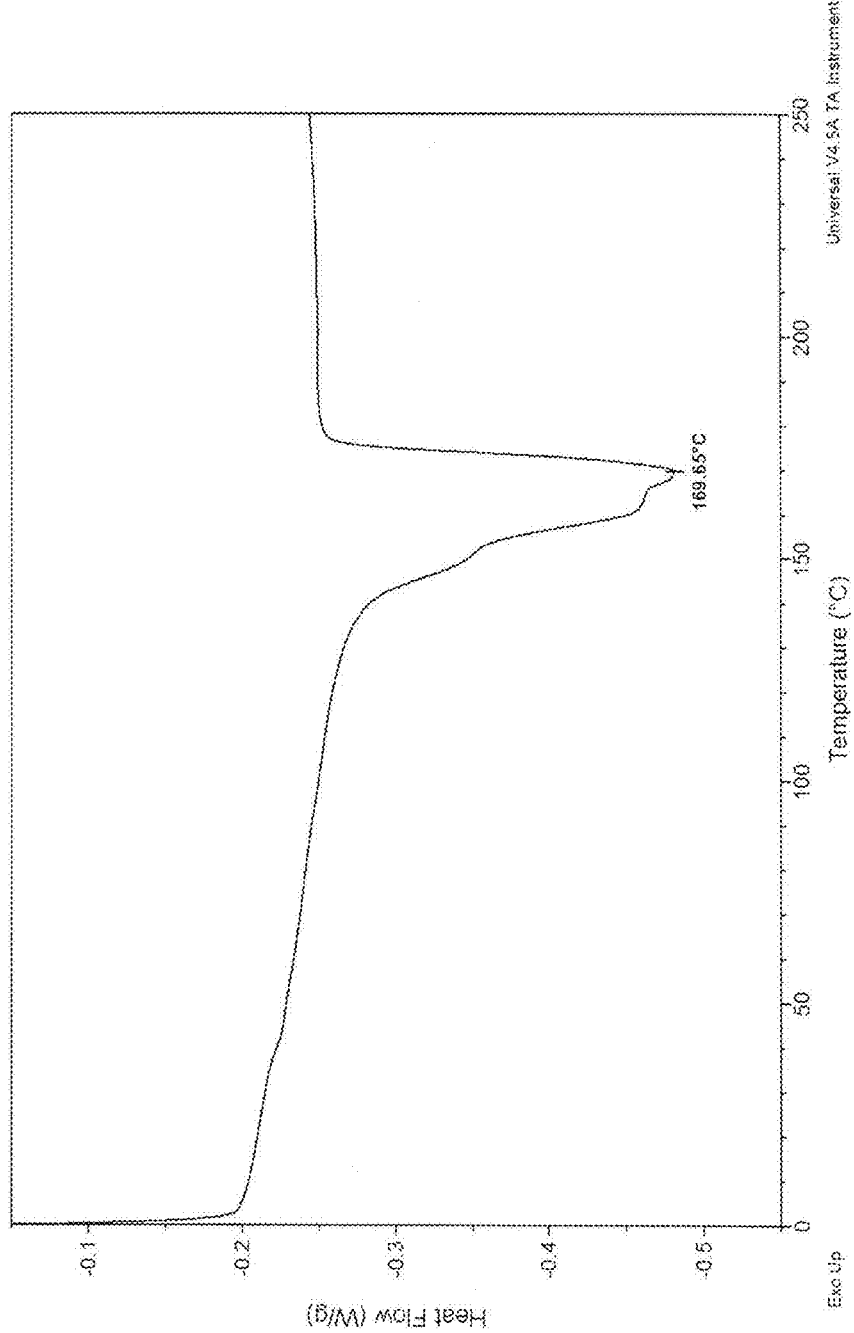
FIG. 5 is a differential scanning calorimetry (DSC) thermogram depicting a melting point associated with a VDF-TFE copolymer made in accordance with at least one embodiment.

The raw dispersion particle size (RDPS) of the VDF-TFE copolymer particle was determined to be 0.174 microns. The VDF monomer concentration in the VDF-TFE copolymer was determined to be 61.5 mol % (50.6 wt %) by NMR. The VDF-TFE copolymer melting point (MP) was determined to be 169.65° C., as shown in FIG. 5. The molecular weight (Mw) of the VDF-TFE copolymer was determined to be 6.24E6 g/mol.

Example 3

The VDF-TFE copolymer of Example 2 was mixed with a perfluorocarbon liquid (Flutec PP11, commercially available from F2 Chemicals Ltd., U.K.) in the ratio of 250 cc of liquid to 0.45 Kg of the VDF-TFE copolymer. This blend was then formed into a cylindrical pellet having a diameter of approximately 6.35 cm by applying vacuum and compressing in a mold. The pellet was then heated in an oven at 150° C. for approximately 4-5 hours. Next, the pellet was loaded into an extruder with an input diameter of approximately 6.35 cm and was ram extruded at a rate of approximately 1.27 cm/sec by pushing the pellet down the barrel of the extruder through die tooling. The die tooling was heated to 150° C. and had an output dimension of approximately 10.16 cm×1.14 mm, creating a reduction ratio of approximately 27:1. A continuous opaque flexible tape having a width of approximately 8.89 cm and a thickness of approximately 1.52 mm was produced. The tape was then dried in an oven at 110° C. to remove the liquid from the tape. A scanning electron micrograph (SEM) of the surface of the unexpanded VDF-TFF tape taken at 15,000× magnification is shown in FIG. 1. Properties of the VDF-TFE tape are shown in Table 1.

TABLE 1

| Specimen | Thickness | Mass/area | Bulk Density | MTS | Porosity |
|---|---|---|---|---|---|
| MD | 1.55 mm | 1721.7 g/m² | 1.11 g/cc | 4.94 MPa | |
| MD | 1.54 mm | 1727.7 g/m² | 11.2 g/cc | 6.42 MPa | |
| MD Avg | 1.55 mm | 1724.4 g/m² | 1.12 g/cc | 5.68 MPa | 43% |
| TD | 1.51 mm | 1794.6 g/m² | 1.19 g/cc | 9.93 MPa | |

TABLE 1-continued

| Specimen | Thickness | Mass/area | Bulk Density | MTS | Porosity |
|---|---|---|---|---|---|
| TD | 1.53 mm | 1760.9 g/m² | 1.15 g/cc | 8.08 MPa | |
| TD Avg | 1.52 mm | 1777.7 g/m² | 1.17 g/cc | 9.0 MPa | 40% |

MD = machine direction
TD = transverse direction

Example 4

Samples were cut from the tape of Example 3 and calendered perpendicular to the extrusion direction. On a calender machine, 20.3 cm diameter rolls were preheated to 140° C. with the gap between the rolls set at 0.30 mm. The speed was 0.91 m/min. After calendering, the samples had a width of approximately 12.7 cm and a thickness of approximately 0.74 mm.

The calendered samples were placed in a pantograph type biaxial batch expander equipped with a convection oven. The samples were permitted to preheat for a period of 5 minutes. After preheating, the samples were simultaneously stretched three times (3×) in the calendered direction and three times (3×) in the transverse (perpendicular to the calender) direction at 10%/sec at 155° C. A scanning electron micrograph (SEM) of the surface of the expanded VDF-TFE membrane having a node and fibril microstructure taken at 15,000× magnification is shown in FIG. 2. An exemplary node 10 and an exemplary fibril 20 are indicated in FIG. 2. Properties of the biaxially expanded VDF-TFE membrane are shown in Table 2.

TABLE 2

| | |
|---|---|
| Gurley (sec) | 435 |
| Bubble Point (MPa) | 0.12 |
| Density (g/cc) | 0.40 |
| Porosity (%) | 79.48 |

Example 5

Samples were cut from the tape of Example 3 and calendered perpendicular to the extrusion direction. On a calender machine, 20.3 cm diameter rolls were preheated to 140° C. with the gap between the rolls set at 0.304 mm. The speed was 0.91 m/min. After calendering, the samples had a width of approximately 12.7 cm and a thickness of approximately 0.74 mm.

The calendered samples were placed in a pantograph type biaxial batch expander equipped with a convection oven. The samples were permitted to preheat for a period of 5 minutes. After preheating, the samples were simultaneously stretched five times (5×) in the calendered direction and five times (5×) in the transverse (perpendicular to the calender) direction at 10%/sec at 155° C. A scanning electron micrograph (SEM) of the surface of the expanded VDF-TFE copolymer membrane having a node and fibril microstructure taken at 9,000× magnification is shown in FIG. 3. An exemplary node 10 and an exemplary fibril 20 is illustrated in FIG. 3. Properties of the biaxially expanded VDF-TFE membrane are shown in Table 3.

TABLE 3

| | |
|---|---|
| Gurley (sec) | 532 |
| Bubble Point (MPa) | 0.24 |
| Density (g/cc) | 0.42 |
| Porosity (%) | 78.5 |

Example 6

Figure 4:
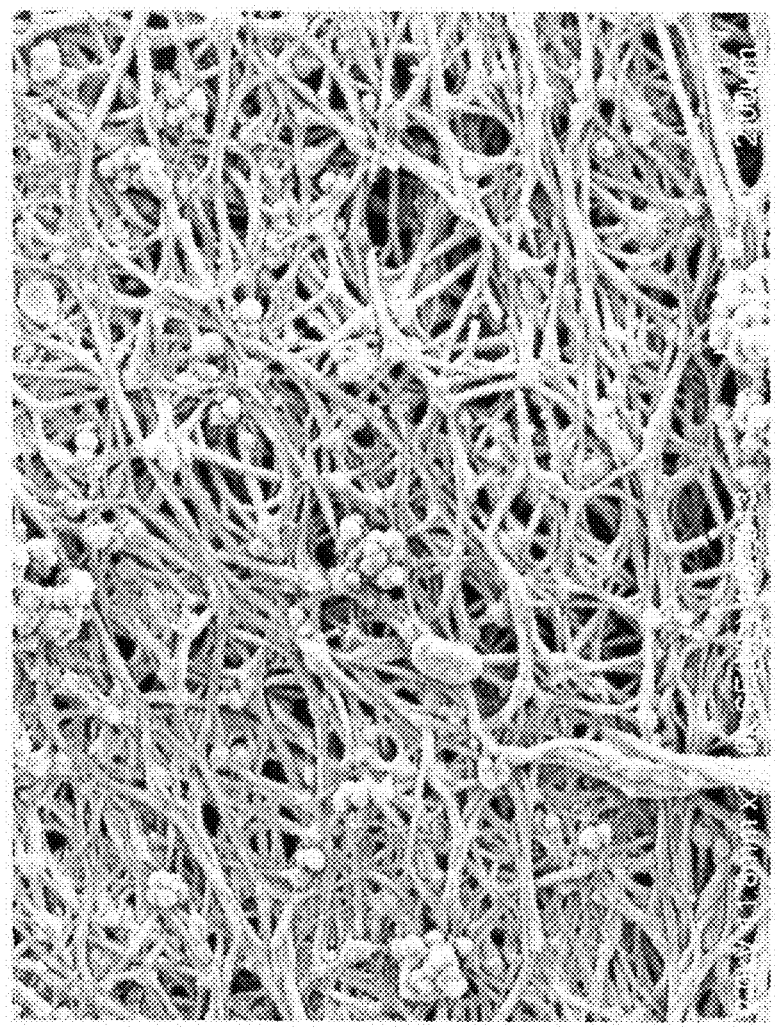
FIG. 4 is a scanning electron micrograph (SEM) of the surface of the porous article of Example 6 taken at 20,000× magnification according to at least one embodiment.

The VDF-TFE copolymer of Example 1 was combined with mineral oil at a ratio of 40 ml mineral oil to 100 g copolymer. The lubricated VDF-TFE copolymer was placed in the laboratory oven at 80° C. to preheat for approximately 1.5 hours before the calender process was started. On a calendering machine, 20.3 cm diameter rolls were preheated to 95° C. with the gap between the rolls set at 0.05 mm and dams installed to produce a 15.2 cm wide tape. The rolls were set to a speed of 0.91 m/min. The VDF-TFE copolymer was introduced into the gap. A continuous opaque flexible tape approximately 0.26 mm thick was produced. Samples were cut from the tape and calendered perpendicular to the original direction (i.e., 90° from original calendering direction) to form a porous article. After the tape was calendered, the lubricant was removed by rinsing with hexane, followed by air drying. A scanning electron micrograph (SEM) of the surface of the porous article taken at 20,000× magnification is shown in FIG. 4.

Figure 7:
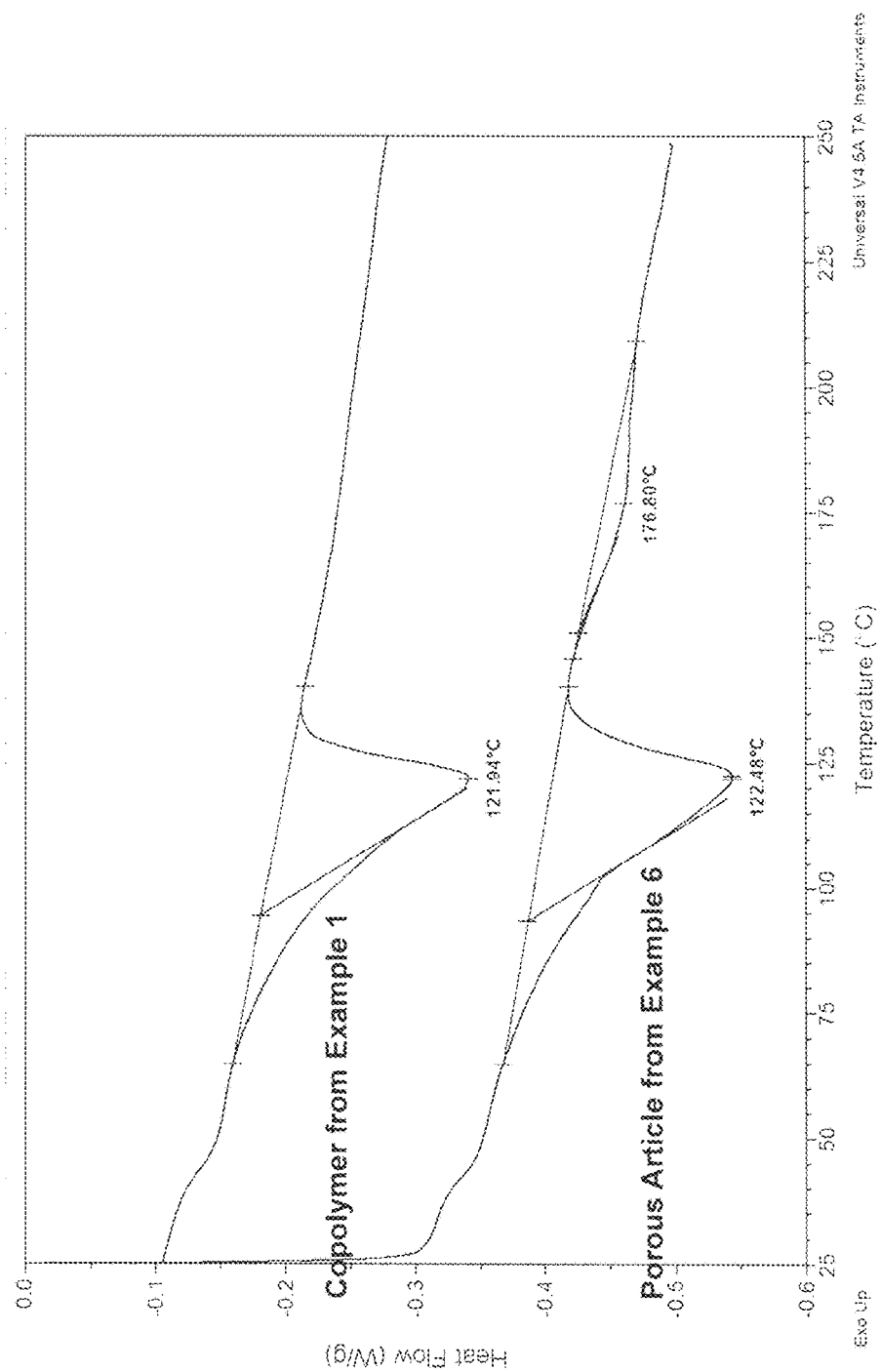
FIG. 7 is a differential scanning calorimetry (DSC) thermogram depicting both the porous article of Example 6 and of the VDF-TFE copolymer of Example 1 according to at least one embodiment.

The porous article was tested by differential scanning calorimetry (DSC) in a temperature range from 25° C. to 250° C. using a sweep rate of 10° C./min. FIG. 7 depicts the DSC thermogram for both the VDF-TFE copolymer tape and for the VDF-TFE copolymer of Example 1. The VDF-TFE copolymer of Example 1 and the VDF-TFE copolymer tape have similar endothermic melting peaks at about 122.48° C. The VDF-TFE copolymer tape demonstrated a second endothermic peak at about 176.8° C.

Example 7

0.80 Kg of deionized (DI) water and 10 g of ammonium perfluorooctanoic acid (APFO) dissolved in 50 mL of water were added to a 4-liter, polymerization reactor equipped with a 3-bladed agitator. The reactor was repeatedly evacuated and pressurized (to about 0.1 MPa or less) with nitrogen until the oxygen level was reduced to 20 ppm or less.

The reactor was then charged with 600 KPa of vinlyidene fluoride (VDF) followed by the addition of 570 KPa of trifluoroethylene (TrFE). The reactor was then heated to 80° C. reaching a pressure of 1.217 MPa. The mixture was then agitated at 800 rpm and ammonium persulfate (APS) in a deionized (DI) water solution (0.15 g/200 mL) was injected, and the reaction pressure started to drop. The reaction pressure continued to drop until 0.85 MPa remained.

The reaction was then stopped and the reaction time was 202 minutes with a 0.367 MPa pressure drop. The reaction vessel was discharged of its contents. The weight of dispersion was 2186 g containing 2.1 wt % solids. The dispersion was coagulated with nitric acid and was dried at 120° C.

Figure 8:
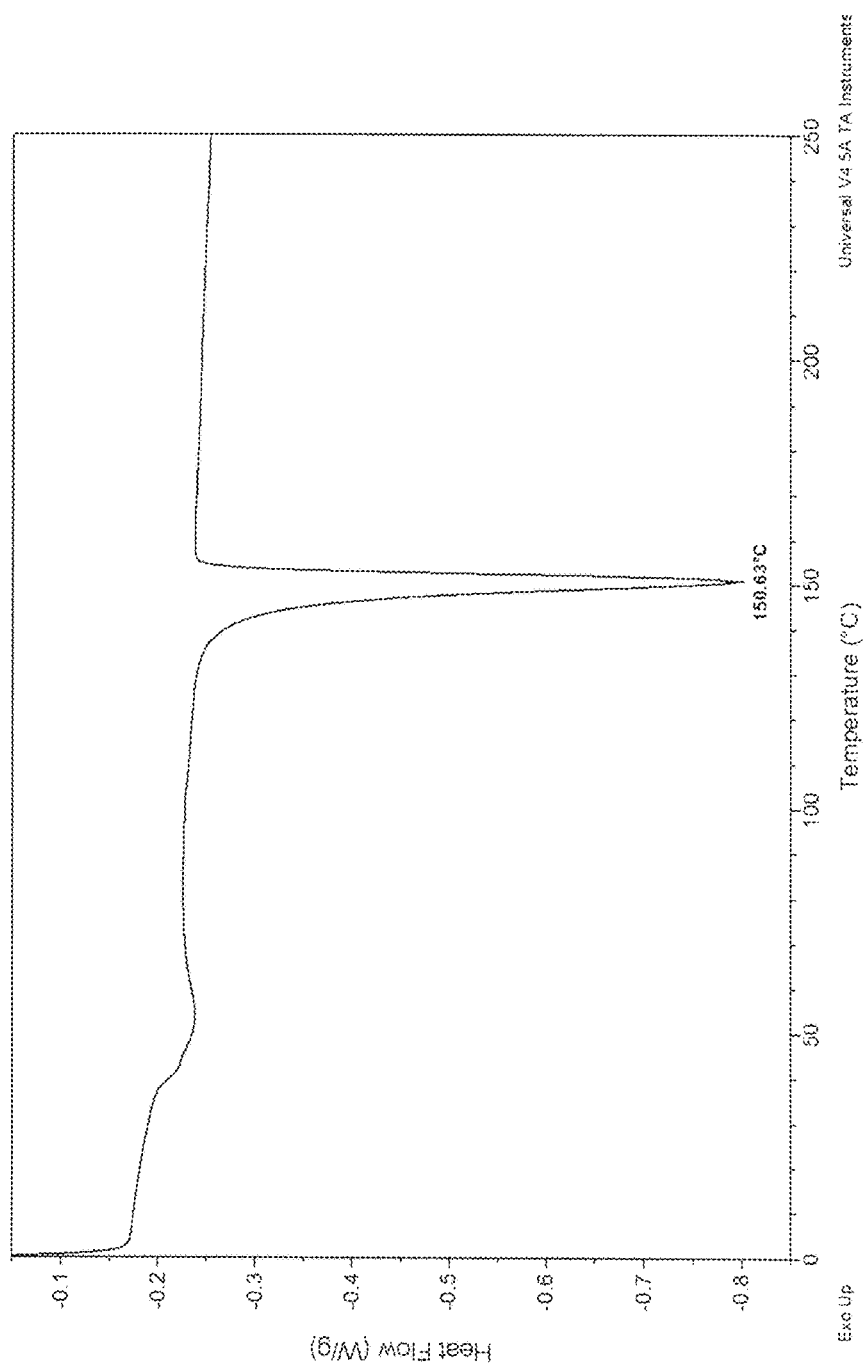
FIG. 8 is a differential scanning calorimetry (DSC) thermogram depicting a maximum melting point for the VDF-TrFE copolymer of Example 7 in accordance with at least one embodiment.

The VDF monomer concentration in the VDF-TrFE copolymer was determined to be 51 mol % (44 wt %) and 49 mol % TrFE monomers (56 wt %) by NMR. The VDF-TrFE copolymer melting point (MP) was determined to be 150.63° C. by differential scanning calorimetry (DSC). The DSC thermogram is depicted in FIG. 8.

Figure 6:
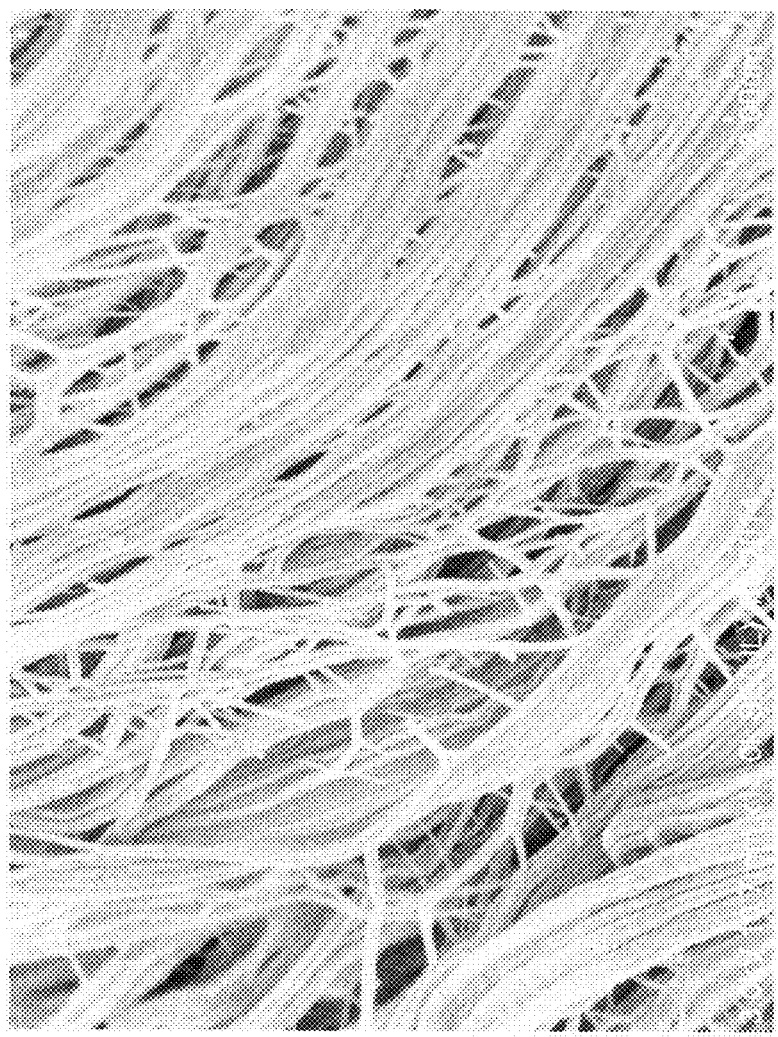
FIG. 6 is a scanning electron micrograph (SEM) of the surface of an expanded VDF-TrFE copolymer membrane taken at 18,000× magnification according to at least one embodiment.

The VDF-TrFE copolymer was combined with mineral oil at a ratio of 40 ml mineral oil to 100 g copolymer. On a calendering machine, 20.3 cm diameter rolls were preheated to 95° C. with the gap between the rolls set at 0.05 mm. The rolls were set to a speed of 0.94 m/min. The VDF-TrFE copolymer was introduced into the gap. A continuous opaque flexible tape approximately 0.26 mm thick was produced. Samples were cut from the tape and calendered perpendicular to the original direction (i.e., 90° from original calendering direction) to form a porous VDF-TrFE article. A scanning electron micrograph of the expanded VDF-TrFE copolymer membrane taken at 18,000× magnification is shown in FIG. 6.

Example 8

The tape produced in Example 3 was placed in a pantograph type biaxial batch expander equipped with a convection oven. The tape was permitted to preheat for a period of 5 minutes. After preheating, the tape was simultaneously expanded five times (5×) in the machine direction and one time (1×) in the transverse direction at a rate of 10%/sec at 155° C. The porosity of the stretched tape was determined to be 49%. Properties of the expanded VDF-TFE tape are shown in Table 4.

TABLE 4

| Specimen | Thickness | Mass/Area | Bulk Density | MTS |
| --- | --- | --- | --- | --- |
| MD | 0.93 mm | 912.2 g/m$^2$ | 0.98 g/cc | 59.5 MPa |
| MD | 0.92 mm | 931.1 g/m$^2$ | 1.02 g/cc | 71.3 MPa |
| Average | 0.92 mm | 921.7 g/m$^2$ | 1.00 g/cc | 65.4 MPa |

MD = machine direction

Example 9

400 g of VDF-TFE copolymer particles from Example 2 and 21.05 g of silica (SYLOID® 620 Silica commercially available from Grace Davison, Columbia, Md.) were combined in a 174 oz container and tumbled for ten minutes to form a mixture. The mixture was placed into an oven at 90° C. for two and a half hours. The mixture was then hand poured into the inwardly turning nip of a calendering machine having two rolls, each 254 mm in diameter. The gap between the rolls was set to 0.127 mm. The mixture was processed through the calendering machine at a temperature of 145° C. and at a speed of 0.61 meters/minute. The resultant filled article was in the form of a sheet having a thickness of 0.711 mm and 5% silica based on total weight of the sheet.

Example 10

400 g of VDF-TFE copolymer particles from Example 2 and 133.33 g of silica (SYLOID®620 Silica commercially available from Grace Davison, Columbia, Md.) were combined in a 174 oz container and tumbled for ten minutes to form a mixture. The mixture was placed into an oven at 90° C. for two and a half hours. The mixture was then hand poured into the inwardly turning nip of a calendering machine having two rolls, each 254 mm in diameter. The gap between the rolls was set to 0.127 mm. The mixture was processed through the calendering machine at a temperature of 145° C. and at a speed of 0.61 meters/minute. The resultant article was brittle in nature and in the form of multiple flat tapes. Six such tapes were stacked on top of each other. The stack was then hand fed back into the inwardly turning nip to form a single tape. The tape was then cut in half into two pieces which were stacked on top of each other and then fed into the inward turning nip of the calendering machine. The resultant filled article was in the form of a sheet having a thickness of 0.559 mm and 25% silica based on the total weight of the sheet.

Example 11

The VDF-TFE copolymer of Example 2 was introduced into the gap of a calendering machine having two rolls, each 20.3 cm in diameter. The rolls were pre-heated to 130° C. with the gap between them set at 0.03 mm. The rolls were run at a speed of 0.61 meters/mm. A clear dense VDF-TFE article was produced. Properties of the dense VDF-TFE article are shown in Table 5. The dense VDF-TFE article had a porosity of about 5%

TABLE 5

|  | Thickness | MTS | Porosity |
| --- | --- | --- | --- |
| MD | 0.73 mm | 20.8 MPa | 5% |

MD = machine direction

Example 12

The dense VDF-TFE article of Example 11 was reintroduced into a calendering machine having two rolls, each 20.3 cm in diameter. The rolls were pre-heated to 130° C. with the gap between them set at 0.03 mm. The rolls were run at a speed of 0.61 meters/min. The intermediate article thus produced was introduced into the calendering machine two more times to form a clear dense VDF-TFE article. Properties of the dense VDF-TFE article are shown in Table 6. The porosity of the dense VDF-TFE article was determined to be about 1%.

TABLE 6

|  | Thickness | MTS | Porosity |
| --- | --- | --- | --- |
| MD | 0.16 mm | 158.1 MPa | 1% |

MD = machine direction

Example 13

The VDF-TFE copolymer of Example 2 was introduced into the gap of a calendering machine having two rolls, each 20.3 cm in diameter. The rolls were pre-heated to 115° C. with the gap between them set at 0.03 mm. The rolls were run at a speed of 0.61 meters/min. The dense article was reintroduced into a calendering machine having two rolls, each 20.3 cm in diameter. The rolls were pre-heated to 130° C. with the gap between them set at 0.03 mm. The rolls were run at a speed of 0.61 meters/min. The intermediate article thus produced was introduced into the calendering machine two more times to form a clear VDF-TFE dense article.

A sample of the dense VDF-TFE article thus produced was cut using a die (according to the geometry described in ASTM D638-5) such that the direction of the die was parallel to the machine direction of the sample. The sample and die were pre-heated to 115° C. to ensure a good cut. The cut sample was constrained on either end on a fixture and then placed into an oven at a temperature of 160° C. for 10 minutes. The heated sample was then stretched to a ratio of 10.4:1 at a rate 0.93 mm/sec based on the die initial gauge length of 18.67 mm. The resultant fiber was 659 Denier. The tenacity of the fiber was measured to be 1.48 g force/Denier (Instron® test conditions: gage length=2.54 cm and Rate: 2.54 cm/min).

The invention of this application has been described above both generically and with regard to specific embodiments. It will be apparent to those skilled in the art that various modifications and variations can be made in the embodiments without departing from the scope of the disclosure Thus, it is intended that the embodiments cover the modifications and variations of this invention provided they come within the scope of the appended claims and their equivalents.

What is claimed is:

1. A process for making a VDF copolymer article comprising:
   calendaring dried agglomerates of vinylidene fluoride (VDF) copolymer particles having about 50 mol % to about 85 mol % VDF monomer at a temperature less than the melt temperature of said dried agglomerates of VDF copolymer particles to form a dense VDF copolymer article,
   wherein said dried agglomerates of VDF copolymer particles have a weight average molecular weight from about 1,000,000 g/mol to about 100,000,000 g/mol.

2. The process of claim 1, wherein said calendering occurs in the absence of a lubricant.

3. The process of claim 1, wherein said melt temperature of said dried agglomerates of VDF copolymer particles is less than about 240° C.

4. The process of claim 1, wherein said calendering occurs at a temperature that is about 80° C. or less below the melt temperature of said dried agglomerates of VDF copolymer particles.

5. The process of claim 1, wherein said dense VDF copolymer has a porosity of less than about 10%.

6. The process of claim 1, wherein said calendering occurs in the absence of heat.

7. The process of claim 1, wherein said dried agglomerates of VDF copolymer particles further comprise at least one member selected from TFE monomers and TrFE monomers.

8. The process of claim 1, further comprising adding a filler material to said dried agglomerates of VDF copolymer particles.

9. The process of claim 1, further comprising expanding said dense VDF copolymer article to form an expanded dense VDF copolymer article.

10. The process of claim 7, wherein said dried agglomerates of VDF copolymer particles further comprise at least one additional comonomer in an amount from about 0.001 mol % to about 10 mol %.

11. The process of claim 1, wherein said VDF copolymer particles have a raw dispersion particle size of 0.174 microns.

* * * * *